United States Patent
Lou

(10) Patent No.: US 11,549,968 B2
(45) Date of Patent: Jan. 10, 2023

(54) PROBING SYSTEM

(71) Applicant: TECAT TECHNOLOGIES (SUZHOU) LIMITED, Suzhou (CN)

(72) Inventor: Choon Leong Lou, Singapore (SG)

(73) Assignee: TECAT TECHNOLOGIES (SUZHOU) LIMITED, Suzhou (CN)

( * ) Notice: Subject to any disclaimer, the term of this patent is extended or adjusted under 35 U.S.C. 154(b) by 87 days.

(21) Appl. No.: 17/182,629

(22) Filed: Feb. 23, 2021

(65) Prior Publication Data
US 2022/0221492 A1    Jul. 14, 2022

(30) Foreign Application Priority Data

Jan. 13, 2021   (CN) .......................... 202120088768.4

(51) Int. Cl.
*G01R 1/067*    (2006.01)
*G01R 1/44*    (2006.01)
(Continued)

(52) U.S. Cl.
CPC ................. *G01R 1/44* (2013.01); *G01K 7/22* (2013.01); *G01R 1/06716* (2013.01); *G01R 31/2831* (2013.01)

(58) Field of Classification Search
CPC ........... G01R 1/06772; G01R 1/07307; G01R 29/0814; G01R 31/26; G01R 1/073; G01R 1/06; G01R 31/2874; G01R 31/2806; G01R 29/12; G01R 29/0835; G01R 29/26; G01R 1/04; G01R 1/07392; G01R 29/08; G01R 27/205; G01R 31/2875; G01R 1/06744;
(Continued)

(56) References Cited

U.S. PATENT DOCUMENTS

| | | | |
|---|---|---|---|
| 5,791,782 A * | 8/1998 | Wooten | G01K 1/143 374/E1.019 |
| 6,114,849 A * | 9/2000 | Price | G01N 27/9006 336/200 |

(Continued)

FOREIGN PATENT DOCUMENTS

| | | |
|---|---|---|
| CN | 106291302 A | 1/2017 |
| CN | 207651272 U | 7/2018 |
| TW | I704354 B | 9/2020 |

OTHER PUBLICATIONS

Preliminary Office Action issued in corresponding CN application No. 202120088768.4 dated Dec. 25, 2020 (4 pages).

*Primary Examiner* — Vinh P Nguyen
(74) *Attorney, Agent, or Firm* — Muncy, Geissler, Olds & Lowe, P.C.

(57) ABSTRACT

A probing system includes a chuck configured to support a device under test (DUT); and a manipulator disposed above the chuck and including a first probe protruding from the manipulator toward the chuck, wherein the first probe includes a temperature-sensing device for sensing a temperature adjacent to a front surface of the DUT. A probing device includes a chuck; a DUT disposed over the chuck; a manipulator disposed above the DUT, wherein the manipulator includes a first probe protruding from the manipulator toward the DUT and including a temperature-sensing device for sensing a temperature, the DUT is moved toward the manipulator for sensing a temperature of the DUT by the first probe.

20 Claims, 2 Drawing Sheets

(51) Int. Cl.
*G01R 31/28* (2006.01)
*G01K 7/22* (2006.01)

(58) Field of Classification Search
CPC ............... G01R 31/2626; G01R 19/00; G01R 31/2855; G01R 31/2896; G01R 33/31; G01R 31/2851; G01R 31/2891; G01R 31/2887; G01R 31/307; G01R 31/2889; G01R 1/18; G01R 31/2886; G01R 1/06711; G01R 1/44; G01R 1/067; G01R 31/2881; G01R 31/36; G01R 1/07342; G01K 1/08; G01K 1/14; G01K 7/16; G01K 1/12; G01K 13/00; G01K 13/02; G01K 13/026; G01K 7/00; G01K 1/022; G01K 1/10; G01K 7/021; G01K 1/146; G01K 11/20; H01R 13/6581; H01R 13/6585; H01R 13/6592; H01R 13/648; H01R 13/6593; H01R 12/775; H01R 13/6598; H01R 13/65912
See application file for complete search history.

(56) References Cited

U.S. PATENT DOCUMENTS

| | | | |
|---|---|---|---|
| 6,424,141 B1* | 7/2002 | Hollman | G01R 31/2851 324/750.19 |
| 7,080,941 B1* | 7/2006 | Benjamin | G01K 1/08 374/208 |
| 7,185,698 B1* | 3/2007 | Bernert, Jr. | F28F 9/0229 165/158 |
| 9,188,624 B2* | 11/2015 | Okada | G01R 31/2642 |
| 2016/0377486 A1 | 12/2016 | Yamashita | |
| 2018/0174929 A1 | 6/2018 | Tamanoi | |
| 2019/0207351 A1 | 7/2019 | Morinari | |

* cited by examiner

PROBING SYSTEM

TECHNICAL FIELD

The present disclosure relates to a probing device including a temperature-sensing probe, and particularly relates to a probing system including a chuck, a manipulator above the chuck, and a temperature-sensing probe protruding from the manipulator and configured to sense a temperature of a device under test (DUT) on the chuck. Further, the present disclosure relates to a probing device for sensing a temperature of a device under test (DUT) by a temperature-sensing probe.

DISCUSSION OF THE BACKGROUND

After fabrication, a semiconductor device under test (DUT), such as a wafer that includes dies, is tested by a probing system. A probe card is used to test electrical properties of the DUT in order to select and discard any defective DUTs. The probe card generally includes several probes protruding from the probe card. Each probe is aligned and then brought into contact with the corresponding contact pad over the DUT during testing.

However, the miniature scale of current DUTs makes for increasingly complicated testing of the DUT. It is difficult to perform such steps and operations on such the small and thin DUT. Further, to reduce cost, the probe card is generally equipped with increasing numbers of probes to contact multiple contact pads of the DUTs, so that testing can be performed on several dies at the same time. An increase in complexity of testing and power management may result in reduced accuracy of the testing.

As such, there is a continuous need to improve configuration of the probe device and the probing method.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a probing system. The probing system includes a chuck configured to support a device under test (DUT); and a manipulator disposed above the chuck and including a first probe protruding from the manipulator toward the chuck, wherein the first probe includes a temperature-sensing device for sensing a temperature of a front surface of the DUT, the temperature-sensing device is surrounded by a thermal conductive member, and an end of the temperature-sensing device protrudes from the thermal conductive member.

In some embodiments, the temperature-sensing device is disposed at an end portion of the first probe adjacent to the DUT.

In some embodiments, the temperature-sensing device includes one of a temperature sensor, a thermistor or a resistive temperature detector (RTD).

In some embodiments, a width of the temperature-sensing device is substantially less than 200 μm.

In some embodiments, the temperature-sensing device includes metallic, ceramic or polymeric material.

In some embodiments, the probing system further includes a second probe disposed adjacent to the first probe and configured for probing and testing the DUT.

In some embodiments, the thermal conductive member is configured to increase thermal conductivity of an end portion of the first probe.

In some embodiments, the thermal conductive member is formed of conductive epoxy.

In some embodiments, a material of the thermal conductive member includes silver (Ag) or gold (Au).

In some embodiments, the probing system further includes a thermal shield surrounding the end portion of the first probe.

In some embodiments, the thermal shield includes Teflon.

In some embodiments, the first probe is flexible and bendable.

In some embodiments, the probing system further includes an electromagnetic shield surrounding a body portion of the first probe.

In some embodiments, a material of the electromagnetic shield includes copper (Cu).

In some embodiments, the first probe is connected to the manipulator through a connector.

Another aspect of the present disclosure provides a probing device. The probing device includes a chuck; a DUT disposed over the chuck; a manipulator disposed above the DUT, wherein the manipulator includes a first probe protruding from the manipulator toward the DUT and the first probe includes a temperature-sensing device for sensing a temperature, the DUT is moved toward the manipulator for sensing a temperature of a front surface of the DUT by the temperature-sensing device, the temperature-sensing device is surrounded by a thermal conductive member, and an end of the temperature-sensing device protrudes from the thermal conductive member.

In some embodiments, during the sensing of the temperature, a distance between the temperature-sensing device and the front surface of the DUT is substantially less than 1 μm.

In some embodiments, the temperature-sensing device contacts the front surface of the DUT during the sensing of the temperature.

In some embodiments, the device further includes a second probe, wherein the front surface of the DUT is probed by the second probe, thereby the sensing of the temperature and the probing of the DUT are performed simultaneously.

In some embodiments, during the sensing of the temperature, a distance between the first probe and the front surface of the DUT or between the second probe and the front surface of the DUT is substantially less than 1 μm.

In some embodiments, the first probe is deformed during the sensing of the temperature.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
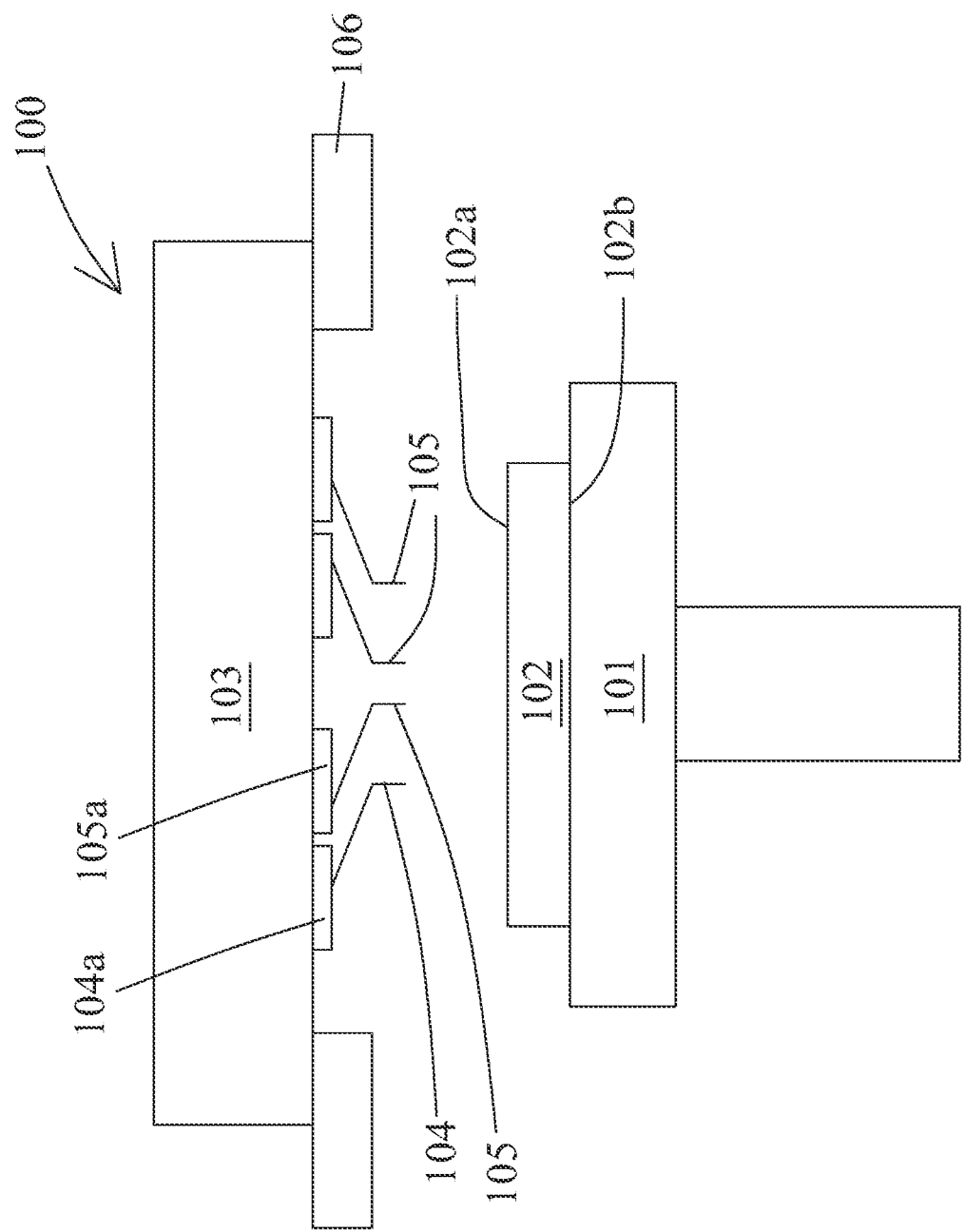
FIG. 1 is a schematic cross-sectional view of a probing system in accordance with some embodiments of the present disclosure.

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

After fabrication, a semiconductor device under test (DUT) may undergo some testing such as 4-wire electrical testing or the like by a probing system. During the testing, heat may be generated, and a temperature of a surface of the DUT may increase. Conventionally, a thermistor is embedded on the surface of the DUT to obtain the temperature of the surface of the DUT during the testing. However, since a dimension of the DUT is getting smaller and smaller, it is no longer feasible to embed the thermistor into such a small DUT.

In the present disclosure, a probing system is disclosed. The probing system includes a manipulator for testing a DUT. The manipulator includes a probe for sensing a temperature. At least one probe protruding from the manipulator can sense or measure a temperature of a surface of the DUT or a temperature adjacent to a testing surface of the DUT. As such, the temperature of the surface of the DUT can be directly obtained.

Since the temperature of the surface of the DUT may affect testing of the DUT, accuracy of the testing result of the DUT can be improved or increased if the temperature of the surface is directly obtained during the testing. Further, since the temperature: sensing probe is placed above the DUT, decrease of the dimension of the DUT would become immaterial. The temperature sensing probe still can be used to measure the temperature from such a small DUT. The temperature of the surface of the DUT still can be accurately obtained. In addition, since the temperature sensing probe is placed above the DUT rather than on the surface of the DUT, such temperature sensing probe can be used for measuring temperature of any DUT.

FIG. 1 is a schematic cross-sectional view of a probing system 100 in accordance with various embodiments of the present disclosure. In some embodiments, the probing system 100 is configured to perform testing of a device under test (DUT) 102. In some embodiments, the probing system 100 includes a chuck 101 and a manipulator 103 disposed above the chuck 101.

In some embodiments, the chuck 101 is configured to hold and support the DUT 102. In some embodiments, the chuck 101 is rotatable about a center of the chuck 101 and is movable toward and away from the manipulator 103. In some embodiments, the chuck 101 has a circular, quadrilateral or polygonal shape.

In some embodiments, the DUT 102 is disposed on the chuck 101 during probing or testing operations. In some embodiments, the DUT 102 is held on the chuck 101 by a suction pulling the DUT 102 toward the chuck 101. In some embodiments, the DUT 102 is drawn toward the chuck 101 using vacuum. In some embodiments, the DUT 102 is held on the chuck 101 by vacuum suction. In some embodiments, the DUT 102 includes circuitry formed on the DUT 102. In some embodiments, several test pads for testing operations are formed over the DUT 102.

In some embodiments, the DUT 102 includes a front surface 102a and a back surface 102b opposite to the front surface 102a. In some embodiments, circuitry or a device is formed over the front surface 102a. In some embodiments, the test pads are formed over the front surface 102a. In some embodiments, the back surface 102b of the DUT 102 contacts the chuck 101 during probing and testing operations. In some embodiments, the DUT 102 is a semiconductor device, a semiconductor structure, a wafer, a chip or the like.

in some embodiments, the manipulator 103 is disposed above the chuck 101. In some embodiments, the manipulator 103 is disposed above the DUT 102. In some embodiments, the manipulator 103 is disposed over a platen 106 and above the chuck 101 and the DUT 102. In some embodiments, the manipulator 103 includes a circuit board for testing the DUT 102. In some embodiments, the manipulator 103 can be a positioner, a probe manipulator, a probe card or the like. In some embodiments, the manipulator 103 is configured to perform testing of a wafer, a device under test (DUT), a die, an integrated circuit (IC) or the like.

In some embodiments, the manipulator 103 is configured to perform electrical, optical or radio frequency (RF) testing. In some embodiments, the manipulator 103 is configured to be mounted on a printed circuit board (PCB), a platen 106 or the like. In some embodiments, the manipulator 103 has a rectangular, quadrilateral or polygonal shape.

In some embodiments, several probes are fixed on the manipulator 103 and protrude from the manipulator 103 toward the chuck 101 and the DUT 102. In some embodiments, the first probes 104 and the second probes 105 are installed on the manipulator 103 using first connectors 104a and second connectors 105a, respectively. In some embodiments, each probe is electrically connected to the circuitry of the manipulator 103 through the first connector 104a or the second connector 105a. In some embodiments, the first connectors 104a and the second connectors 105a can be SMA (sub-miniature version A) connectors or any other suitable types of connector.

In some embodiments, the probes include a first probe 104 and a second probe 105. In some embodiments, the first probe 104 and the second probe 105 are integrated with the manipulator 103. In some embodiments, a signal (e.g., an electrical, RF or optical signal) can be transmitted from an external circuitry or the manipulator 103 to the first probe 104 and the second probe 105. In some embodiments, the first probe 104 and the second probe 105 are configured to transmit or receive a signal.

In some embodiments, the first probe 104 is disposed adjacent to the second probe 105. In some embodiments, the first probe 104 is configured to sense or measure a temperature. In some embodiments, the temperature-sensing device 104e on the first probe 104 is electrically connected to the circuit board of the manipulator 103 through the first connector 104a.

In some embodiments, the second probe 105 is disposed adjacent to the first probe 104 and configured to probe and test the DUT 102. In some embodiments, the second probe 105 is configured to contact the test pad disposed over the DUT 102. In some embodiments, the circuitry of the DUT 102 is electrically connected to the circuit board of the manipulator 103 through the second probe 105 during probing or testing. In some embodiments, the second probe 105 is connected to the manipulator 103 through the second connector 105a.

Figure 2:
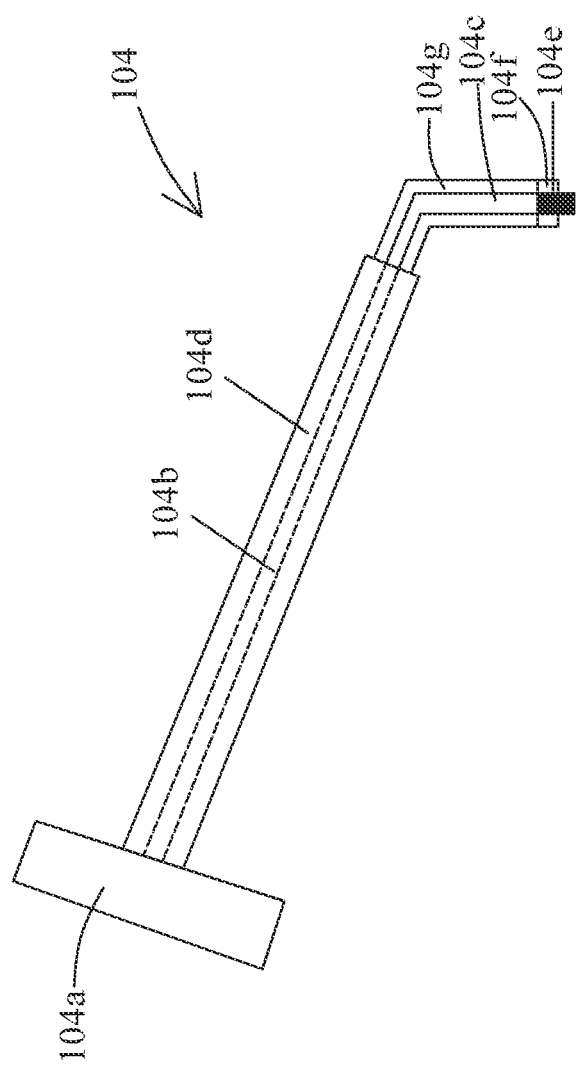
FIG. 2 is an enlarged cross-sectional view of a temperature-sensing probe in the probing system of FIG. 1.

FIG. 2 is an enlarged cross-sectional view of the first probe 104. In some embodiments, the first probe 104 is a temperature-sensing probe. In some embodiments, the first probe 104 includes a body portion 104b and an end portion 104c coupled to the body portion 104b. In some embodiments, the body portion 104b and the end portion 104c extend in different directions, such that an angle is formed between the body portion 104b and the end portion 104c. In some embodiments, the end portion 104c is substantially perpendicular to the front surface 102a of the DUT 102. In some embodiments, an interior angle between the body portion 104b and the end portion 104c is about 80° to about 160°. In some embodiments, several electrical wires are included in the body portion 104b and extend between the temperature-sensing device 104e and the first connector 104a.

In some embodiments, the first probe 104 is flexible and bendable. In some embodiments, the first probe 104 is flexible and deformable relative to the first connector 104a.

In some embodiments, the body portion 104b extends between the first connector 104a and the end portion 104c. In some embodiments, the body portion 104b is surrounded by an electromagnetic shield 104d. In some embodiments, the body portion 104b is entirely or partially surrounded by the electromagnetic shield 104d. In some embodiments, the electromagnetic shield 104d is configured to minimize disturbance of the first probe 104 caused by electromagnetic radiation from the surrounding environment. In some embodiments, the electromagnetic shield 104d includes metallic material such as copper or the like.

in some embodiments, the first probe 104 includes a temperature-sensing device 104e for sensing a temperature. In some embodiments, the temperature-sensing device 104e is configured to sense a temperature of a surface of the DUT 102 or a temperature adjacent to a surface of the DUT 102. In some embodiments, the temperature-sensing device 104e can sense or measure a temperature of the front surface 102a of the DUT 102.

In some embodiments, the temperature-sensing device 104e is disposed at the end portion 104c of the first probe 104. In some embodiments, the temperature-sensing device 104e is disposed adjacent to the DUT 102 or the front surface 102a of the DUT 102. In some embodiments, the temperature-sensing device 104e is disposed at or attached to a probing tip of the first probe 104. In some embodiments, the temperature-sensing device 104e includes a temperature sensor, a thermistor or resistive temperature detector (RTD). In some embodiments, the temperature-sensing device 104e includes metallic, ceramic or polymeric material. In some embodiments, a width of the temperature-sensing device 104e is substantially less than 200 µm. In some embodiments, the width of the temperature-sensing device 104e is substantially less than 100 µm. In some embodiments, the width of the temperature-sensing device 104e is substantially less than 50 µm.

In some embodiments, the temperature-sensing device 104e is surrounded by a thermal conductive member 104f. In some embodiments, an end of the temperature-sensing device 104e protrudes from the thermal conductive member 104f. In some embodiments, the thermal conductive member 104f is configured to improve or increase thermal conductivity of the end. portion 104c of the first probe 104. In some embodiments, the thermal conductive member 104f is formed of conductive epoxy. In some embodiments, the thermal conductive member 104f includes metallic material such as silver (Ag), gold (Au) or the like.

In some embodiments, the end portion 104c of the first probe 104 is surrounded by a thermal shield 104g. In some embodiments, the end portion 104c disposed between the electromagnetic shield 104d and the temperature-sensing device 104e is wrapped by the thermal shield 104g. In some embodiments, the thermal shield 104g includes non-thermal conductive material such as plastics, Teflon, polymer or the like.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A probing system comprising:
a chuck configured to support a device under test (DUT); and
a manipulator disposed above the chuck and including a first probe protruding from the manipulator toward the chuck,
wherein the first probe includes a temperature-sensing device for sensing a. temperature of a front surface of the DUT, the temperature-sensing device is surrounded by a thermal conductive member, and an end of the temperature-sensing device protrudes from the thermal conductive member.

2. The probing system of claim 1, wherein the temperature-sensing device is disposed at an end portion of the first probe.

3. The probing system of claim 2, further comprising a thermal shield surrounding the end portion of the first probe.

4. The probing system of claim 3, wherein the thermal is shield includes Teflon.

5. The probing system of claim 1, wherein the temperature-sensing device includes one of a temperature sensor, a thermistor or a resistive temperature detector (RTD).

6. The probing system of claim 1, wherein a width of the temperature-sensing device is substantially less than 200 µm.

7. The probing system of claim 1, wherein the temperature-sensing device includes metallic, ceramic or polymeric material.

8. The probing system of claim 1, further comprising a second probe disposed adjacent to the first probe and configured for probing and testing the DUT.

9. The probing system of claim 1, the thermal conductive member is configured to increase thermal conductivity of an end portion of the first probe.

10. The probing system of claim 1, wherein the thermal conductive member is formed of conductive epoxy.

11. The probing system of claim 1, wherein a material of the thermal conductive member includes silver (Ag) or gold (Au).

12. The probing system of claim 1, wherein the first probe is flexible and bendable.

13. The probing system of claim 1, further comprising an electromagnetic shield surrounding a body portion of the first probe.

14. The probing system of claim 13, wherein a material of the electromagnetic shield includes copper (Cu).

15. The probing system of claim 1, wherein the first probe is connected to the manipulator through a connector.

16. A probing device, comprising:
a chuck;
a device under test (DUT) disposed over the chuck; and
a manipulator disposed above the DUT, wherein the manipulator includes a first probe protruding from the manipulator toward the DUT and the first probe includes a temperature-sensing device for sensing a temperature,
wherein the DUT is moved toward the manipulator for sensing the temperature of a front surface of the DUT by the temperature-sensing device, the temperature-sensing device is surrounded by a thermal conductive member, and an end of the temperature-sensing device protrudes from the thermal conductive member.

17. The probing device of claim 16, wherein during the sensing of the temperature, a distance between the temperature-sensing device and the front surface of the DUT is substantially less than 1 µm.

18. The probing device of claim 16, wherein the temperature-sensing device contacts the front surface of the DUT during the sensing of the temperature.

19. The probing device of claim 16, further comprising a second probe, wherein the front surface of the DUT is probed by the second probe, thereby the sensing of the temperature and the probing of the DUT are performed simultaneously.

20. The probing device of claim 19, wherein the first probe and the second probe are deformed during the sensing of the temperature.

* * * * *